United States Patent
Griffin et al.

(10) Patent No.: US 8,661,881 B2
(45) Date of Patent: *Mar. 4, 2014

(54) HUB UNIT FOR A HIGH TEMPERATURE ELECTRONIC MONITORING SYSTEM

(75) Inventors: Gregory Keelen Griffin, Mason, OH (US); John David Weickert, Fairfield, OH (US); Eric John Bair, West Chester, OH (US)

(73) Assignee: General Electric Company, Schenectady, NY (US)

( * ) Notice: Subject to any disclaimer, the term of this patent is extended or adjusted under 35 U.S.C. 154(b) by 62 days.

This patent is subject to a terminal disclaimer.

(21) Appl. No.: 12/977,215

(22) Filed: Dec. 23, 2010

(65) Prior Publication Data

US 2012/0163958 A1   Jun. 28, 2012

(51) Int. Cl.
*G01M 15/14* (2006.01)
(52) U.S. Cl.
USPC ............................................. 73/112.01
(58) Field of Classification Search
USPC ......... 374/57, 4, 161, 137, 110, 12, 141, 144; 369/19, 59.1; 361/70, 74, 236; 364/557, 468.01, 528.25; 710/100; 73/112.01
See application file for complete search history.

(56) References Cited

U.S. PATENT DOCUMENTS

| | | | |
|---|---|---|---|
| 3,995,485 A * | 12/1976 | Beyer et al. .................. 374/33 |
| 4,188,617 A * | 2/1980 | Fauchier et al. ......... 340/870.13 |
| 4,539,652 A * | 9/1985 | Rubin .......................... 710/100 |
| 5,734,596 A * | 3/1998 | Medelius et al. ............. 702/107 |
| 5,838,588 A * | 11/1998 | Santoso et al. ............... 700/287 |
| 6,115,654 A * | 9/2000 | Eid et al. ..................... 701/29.8 |
| 6,414,612 B1 * | 7/2002 | Quesenberry ................. 341/120 |
| 6,721,631 B2 * | 4/2004 | Shimizu et al. ............... 700/287 |
| 6,744,376 B1 * | 6/2004 | Pascalidis ................. 340/870.21 |
| 6,990,432 B1 * | 1/2006 | McCarthy et al. ............. 702/184 |
| 7,231,180 B2 * | 6/2007 | Benson et al. ................ 455/41.2 |
| 7,263,459 B2 * | 8/2007 | Ito et al. ....................... 702/138 |
| 7,739,216 B2 | 6/2010 | Schachtely et al. |
| 8,161,806 B1 * | 4/2012 | Weickert et al. ........... 73/112.01 |
| 2005/0088316 A1 | 4/2005 | Mallison et al. |
| 2006/0041368 A1 | 2/2006 | Williams et al. |
| 2007/0124532 A1 * | 5/2007 | Bennett ........................ 711/100 |
| 2008/0092826 A1 * | 4/2008 | Kishimoto et al. .......... 122/14.1 |

OTHER PUBLICATIONS

Multifunction Data Acquisition Board, "High Speed M Series Multifunction Data Acquisition", National Instruments, Dec. 1, 2008.*

* cited by examiner

*Primary Examiner* — Lisa Caputo
*Assistant Examiner* — Nasir U Ahmed
(74) *Attorney, Agent, or Firm* — William Scott Andes; Gary M. Hartman; Domenica N. S. Hartman

(57) ABSTRACT

A hub unit adapted for use in a monitoring system that monitors engine performance parameters of a gas turbine engine. The hub unit includes a housing, at least one signal conditioning circuit board within the housing and adapted to receive the analog sensor outputs from the sensors, and a control circuit board within the housing, connected to the signal conditioning circuit board, and adapted to produce digital data corresponding to analog sensor outputs. The control circuit board and the signal conditioning circuit board each comprise electrical circuit components that define an analog signal processing path and have accuracy and precision characteristics that drift in response to component aging and to changes in the temperature to which the hub unit is subjected. The hub unit performs a continuous calibration scheme to determine and remove errors in the analog signal processing path resulting from the drifts of the electrical circuit components.

17 Claims, 5 Drawing Sheets

HUB UNIT FOR A HIGH TEMPERATURE ELECTRONIC MONITORING SYSTEM

BACKGROUND OF THE INVENTION

The present invention generally relates to electronic equipment, and more particularly to electronic hardware capable of operating within a high temperature environment, such as on or adjacent a gas turbine engine.

Aircraft gas turbine engines undergo testing during their development, as well as during production and subsequent servicing. Numerous engine performance parameters are typically monitored to assess the performance of an engine, including various temperatures, pressures, flow rates, forces, rotational speeds, etc. As nonlimiting examples, it is typically desirable to monitor engine inlet, compressor and exhaust gas temperatures, pressures within the fan, compressor and turbine sections, fuel and airflow rates, compressor and fan rotor speeds, blade tip clearances, mechanical stresses and part vibrations. Development and flight test aircraft engines may be required to have thousands of sensors to monitor the various parameters of interest.

Engine testing is typically conducted on a stationary test stand that is often located outdoors. A nonlimiting example of such a test stand 100 is schematically represented in FIG. 1. The stand 100 is represented as including a vertical support column 102 mounted to a foundation 104 in the ground, and a head (thrust) frame 106 mounted on the column 102 from which an aircraft engine 108 is mounted for testing. The head frame 106 includes an adapter 110 to which the engine 108 is attached with a pylon 112 that is appropriately configured for the particular engine 108.

During engine testing, the engine 108 and its immediate surroundings can reach very high temperatures. For example, temperatures may approach or exceed 260° C. surrounding the engine core beneath the engine cowling (nacelle) 114, as well as on the head frame 106 and its adapter 110. While sensors used to monitor the engine 108 have been developed to withstand these temperatures, the electronics used to process the sensor data have been limited to much lower temperatures. For example, typical commercial electronic components are often limited to about 85° C., and even military standard components are typically rated to not higher than 125° C. As such, each sensor typically requires a separate continuous wire or tube to carry its output signal to a remote data acquisition system, which is often located within an enclosed facility equipped with a controlled environment. The facility may be a considerable distance from the engine test stand, for example, 50 meters to in excess of 300 meters. Routing, managing and maintaining the numerous (potentially thousands) of data wires and tubes requires a considerable effort. Consequently, the ability to reduce the length and number of wires and tubes would be helpful and beneficial.

BRIEF DESCRIPTION OF THE INVENTION

The present invention provides a hub unit adapted for use in a monitoring system adapted to monitor engine performance parameters of a gas turbine engine operating on a stationary test stand, or during on-wing flight test, or during normal aircraft operation, and particularly a monitoring system comprising sensors mounted on the engine for sensing the engine performance parameters and generating digital sensor outputs.

According to a first aspect of the invention, the hub unit includes a housing, at least one signal conditioning circuit board within the housing and adapted to receive the analog sensor outputs from the sensors, and a control circuit board within the housing, connected to the signal conditioning circuit board, and adapted to produce digital data corresponding to analog sensor outputs. The control circuit board and the signal conditioning circuit board each comprise electrical circuit components that define an analog signal processing path and have accuracy and precision characteristics that drift in response to component aging and to changes in the temperature to which the hub unit is subjected. The hub unit further includes means for performing a continuous calibration scheme by periodically applying a reference voltage and a zero voltage to the signal conditioning circuit board to determine and remove errors in the analog signal processing path resulting from the drifts of the electrical circuit components of the control circuit board and the signal conditioning circuit board.

According to a second aspect of the invention, in addition to certain aspects recited above, the hub unit may further include means on the signal conditioning circuit board for multiplexing a plurality of the analog sensor outputs generated by the sensors to produce an individual multiplexed analog output, and at least one amplifier with adjustable gain for scaling the analog sensor outputs of the individual multiplexed analog output to produce an individual conditioned multiplexed analog output from which the corresponding digital data are produced. The amplifier and the adjustable gain thereof are controlled by the control circuit board.

A technical effect of the invention is the ability of the hub unit to operate at high temperatures, for example, higher temperatures than possible with more temperature-sensitive hardware of the type conventionally used to process digital data. As such, data processing can be performed at a location remote from the high temperature environment being monitored. On the other hand, the hub unit and particularly its control and signal conditioning circuit boards can be specially adapted for high temperature operation, preferably without the use of active cooling. Furthermore, the continuous calibration scheme removes errors that would otherwise exist in the analog signal processing path as a result of the accuracy and precision characteristics of the electrical circuit components of the control circuit board and the signal conditioning circuit board tending to drift due to component aging and the high temperature environment of the hub unit. In accordance with the second aspect of the invention, the multiplexing capability can reduce the number of wires or cables necessary to transmit data to the remotely-located distributor unit.

Other aspects and advantages of this invention will be better appreciated from the following detailed description.

DETAILED DESCRIPTION OF THE INVENTION

Figure 1:
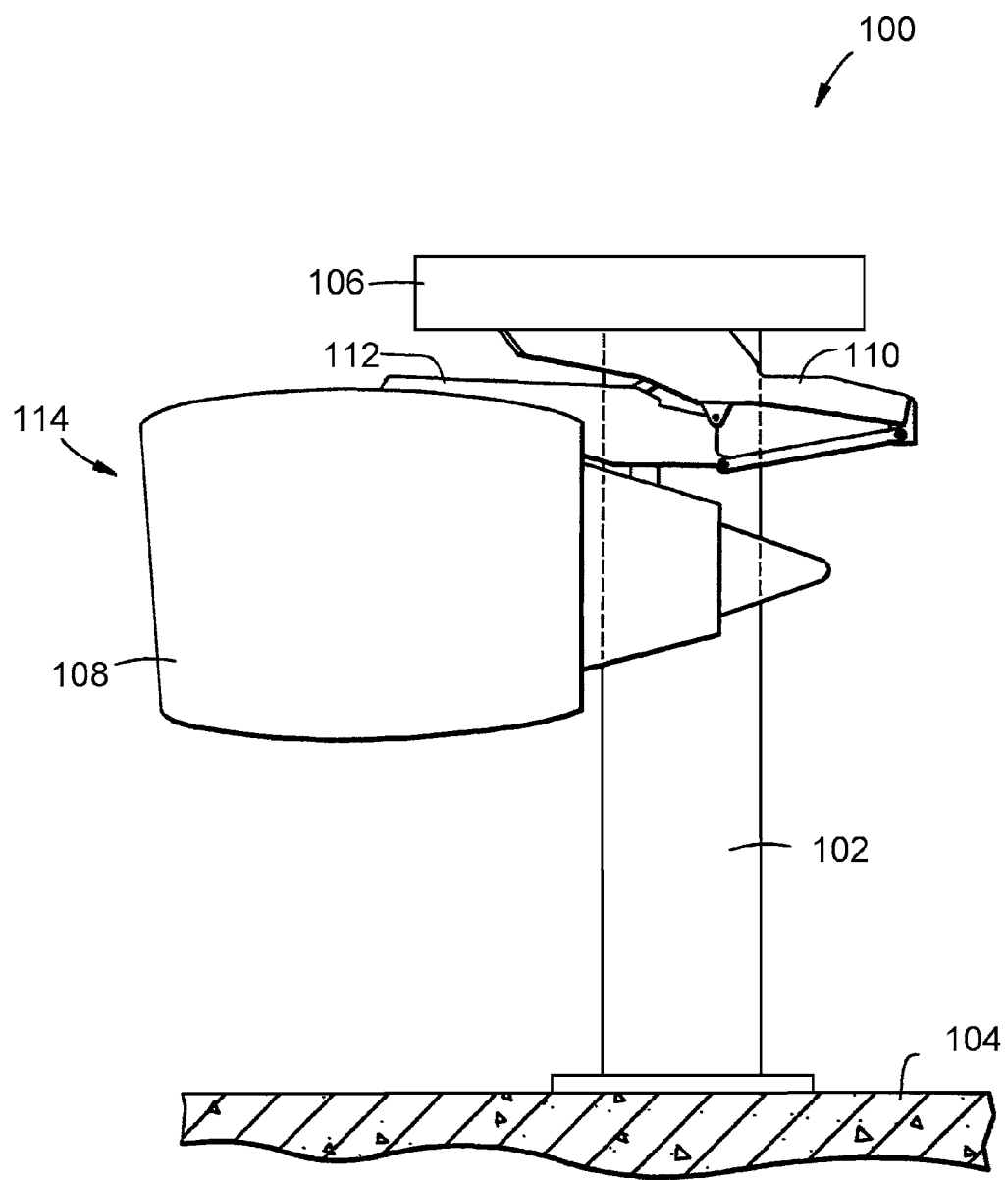
FIG. 1 is a schematic representation of a test stand for a gas turbine engine.
Figure 2:
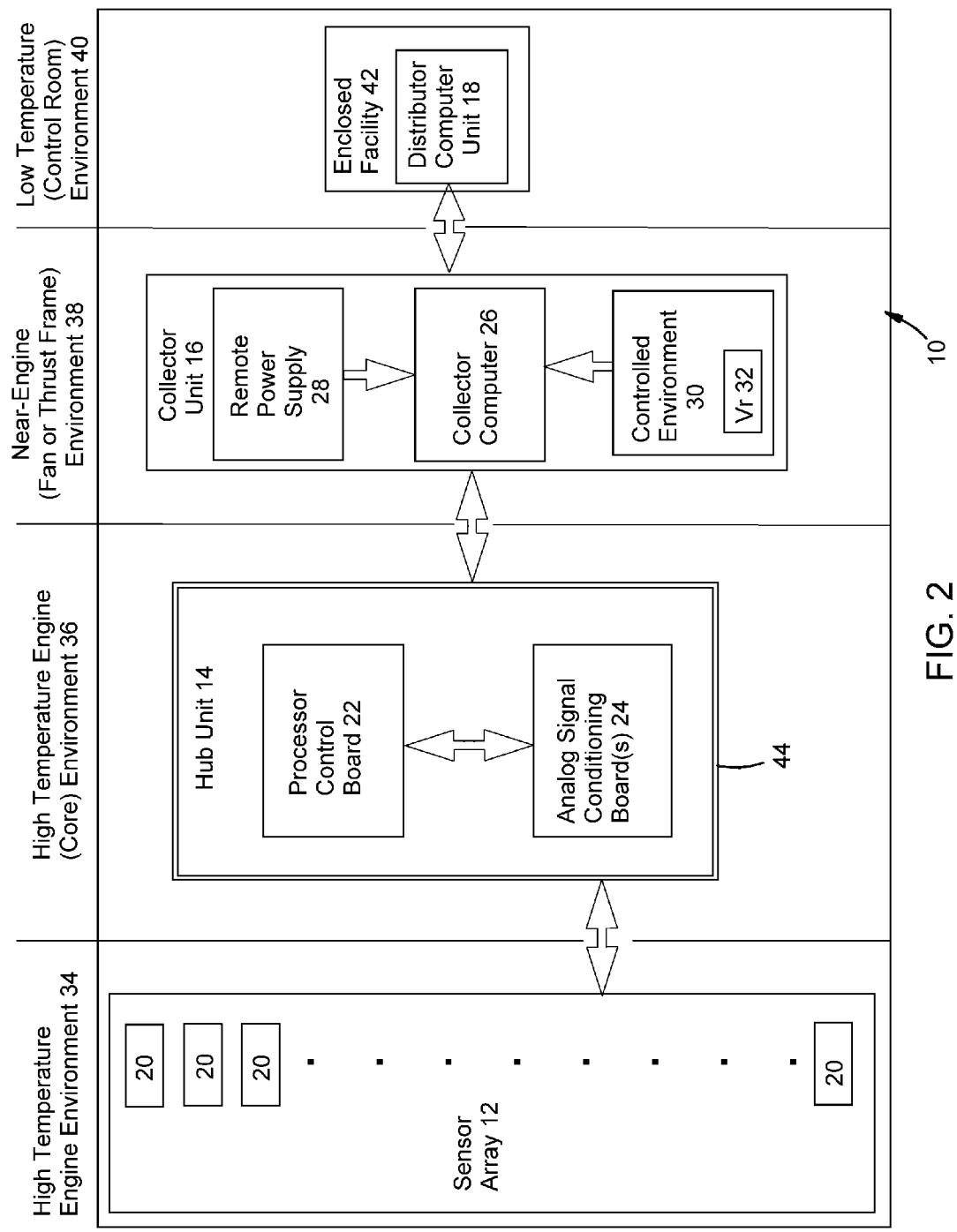
FIG. 2 is a block diagram representing tiered units of a monitoring system adapted for monitoring performance parameters of a gas turbine engine operating while mounted on a test stand, such as of the type represented in FIG. 1.

FIG. 2 is a block diagram representing various units of a monitoring system 10 adapted for monitoring performance parameters of a gas turbine engine while the engine is mounted and operating on a stationary test stand, for example, the test stand 100 represented in FIG. 1. The system 10 can also be used to monitor an engine during on-wing flight tests, as well as during normal aircraft operation. While the monitoring system 10 is particularly well suited for monitoring a gas turbine engine, and for convenience will be described in reference to the engine 108 and its stand 100 represented in FIG. 1, the use of the system 10 is not limited to such applications. Instead, the system 10 is more broadly applicable to a wide variety of situations in which there is a desire or need to monitor performance parameters of an apparatus operating in an environment subjected to elevated temperatures.

As represented in FIG. 2, the system 10 is generally identified as having units 12, 14, 16 and 18 that are located in four environments 34, 36, 38 and 40 with respect to the gas turbine engine 108. The first unit 12 comprises an array of sensors 20 appropriately located in and around the engine 108 to monitor performance parameters of the engine 108 for the purpose of assessing the performance of the engine. Any number of sensors 20 may be employed by the system 10, and the sensors 20 may be of various types, for example, to monitor temperatures, pressures, flow rates, forces, rotational speeds, etc., of the engine 108, as was previously discussed in reference to FIG. 1. Certain types of sensors 20 are typically employed in large numbers during the monitoring of engine operation, including thermocouples, resistance temperature detectors (RTDs), and pressure transducers. Because the sensors 20 are located to directly detect the parameters of interest, the unit (array) 12 of sensors 20 is indicated in FIG. 2 as being located in a "high temperature engine environment" 34, where maximum temperatures exceeding 200° C. are often encountered by the system 10 and may reach as high as 260° C. or more. Suitable sensors 20 for use in the system 10 are commercially available and commonly used for monitoring gas turbine engine parameters, and therefore will not be discussed in any detail here. The particular output signals generated by the sensors 20 will depend on the type of sensors 20 used, though in most cases the signals will be analog signals that must be digitized in order for their data to be used by computer processing equipment to assess the performance of the engine.

The remaining primary units 14, 16 and 18 of the system 10 are identified in FIG. 2 as located in environments 36, 38 and 40 where lower temperatures are likely to occur. A first of these units will be referred to as a hub unit 14, with which the sensors 20 directly communicate through any suitable wires, tubes, or other appropriate connectors commonly employed with the particular type of sensors 20 used. The hub unit 14 represented in FIG. 2 will typically be one of a number of hub units 14 that may be used in the system 10, depending on the number of sensors 20 and the number of sensors 20 each hub unit 14 can manage. Similar to the environment 34 for the sensors 20, the environment 36 for the hub unit 14 is identified as a "high temperature engine environment" 34, in that the hub units 14 are adapted to be located in close proximity to the engine 108, for example, within about three meters of the engine 108, such as the engine core environment beneath the engine cowling 114. In addition to locations directly on the engine 108 and beneath its cowling 114, other locations may include adjacent locations on the head frame 106 or adapter 110 of the stand 100, where very high temperatures are still likely to be encountered by the system 10. For example, temperatures beneath the cowling 114 and adjacent locations on the head frame 106 or adapter 110 often exceed 125° C., and can reach much higher temperatures, for example, higher than 200° C. and potentially as high as 260° C. or more. Consequently, electronic components of the hub units 14 must be capable of withstanding significantly higher temperatures than is possible with conventional electronic components and even military standard components.

In contrast, the environments 38 and 40 for the remaining two units 16 and 18 of the system 10, referred to as a collector unit 16 and a distributor unit 18, are identified as a "near-engine environment" 38 and a "low temperature environment" 40. The former is designated as such because the collector unit 16 is adapted to be located in proximity to the engine 108 but not as close to the engine core as the hub units 14. For example, the collector unit 16 may be located within the engine fan case environment or on the stand 100, such as on the head (thrust) frame 106, at distances of about three to ten meters from the core of the engine 108. At these locations, temperatures will usually exceed 55° C., but are significantly less than 260° C. and typically less than 125° C. Consequently, electronic components of the collector unit 16 must typically be capable of withstanding high temperatures, though not as high as the hub units 14. In some situations, military standard components rated up to 125° C. may be used, and possibly conventional electronic components rated up to 85° C.

On the other hand, the low temperature environment 40 of the distributor unit 18 permits the use of conventional electronic components rated at no more than 85° C. The environment 40 is designated as "low temperature" in that the distributor unit 18 can be and preferably is located in a controlled-temperature environment, for example, an enclosed facility that is near the test stand 100 and is stabilized with air-conditioning to maintain a temperature of less than 55° C. For on-wing engine operation, the environment 40 may be within the aircraft. The distributor unit 18 preferably has the most processing power of the system 10, and therefore will typically comprise one or more computer servers, personal computers, and/or other processing equipment adapted for data processing, collectively represented by a distributor computer 42 in FIG. 2. In addition to a real-time calibration functionality discussed below, the distributor computer 42 may also provide the capability of engineering unit conversion, system configuration, and database functionality. Suitable equipment for the distributor computer 42 are likely to be relatively sensitive to temperature, and therefore benefit from being housed at roughly room temperature. The low temperature environment 40 is typically remotely located from the engine test stand 100, for example, in excess of fifty meters.

FIG. 2 schematically represents the hub unit 14 as comprising a processor control board 22 and one or more analog signal conditioning boards 24. These boards 22 and 24 are preferably enclosed in a housing 44, schematically represented in FIG. 2 as completely surrounding and enclosing the boards 22 and 24. The processor control board 22 and analog signal conditioning boards 24 operate together to convert the analog output signals of the sensors 20 to digital data that can be processed by the distributor unit 18. According to certain preferred aspects of the invention, the processor control board 22 and analog signal conditioning boards 24 also combine to perform additional processes to ensure the integrity of the analog output signals received from the sensors 20 prior to their analog-digital conversion. As will be explained in more detail below, one such additional process is to provide a continuous calibration feature that detects any drift in the accuracy and precision characteristics of the electronic components of the analog signal conditioning boards 24 and the processor control board 22 that can result from component aging and variations in temperature, such as the extreme temperature changes to which the hub unit 14 is subjected. The calibration feature produces calibration data that can be used by the distributor computer 42 to perform real-time corrections of the digital data acquired from the hub unit 14 via the collector unit 16, and more particularly a collector computer 26 of the unit 16. Another preferred process is to multiplex the analog output signals of multiple sensors 20 into multiplexed analog outputs, thereby reducing the number of connections required to transmit the digital data to the collector unit 16 over, for example, a serial data connector such as an RS-485 serial communications cable. Still another preferred process is to interleave the multiplexed analog outputs of one group (bank) of sensors 20 with the multiplexed analog outputs of other banks of sensors 20, so that the individual analog output signals of the multiplexed analog outputs more quickly "settle" between the sets of outputs. These and other aspects of the hub unit 14 will be discussed in further detail below.

The collector unit 16 is schematically represented in FIG. 2 as comprising the collector computer 26, a power supply 28, and a temperature-controlled environment 30 that contains a system voltage reference device 32, as will be explained in more detail below. The primary function of the power supply 28 is to supply power to the electronic components of the system 10, including the sensors 20 (as may be required) and the electronic components housed in the hub unit 14. A preferred power supply 28 is a dual topology design with a switching regulator front end and linear regulator back end. The power supply 28 may be configured to generate multiple independently-regulated voltages for each hub unit 14 to increase system fault tolerance and decrease noise coupling. The collector computer 26 receives the digital data from the hub unit 14, as well as any additional hub units 14 contained in the system 10, prior to forwarding the digital data to the distributor computer 42 of the distributor unit 18. The collector computer 26 is preferably configured to have a logging capability for synchronizing the flow of the digital data to the distributor computer 42, for example, utilizing inter-range instrumentation group (IRIG) time codes or a Network Time Protocol (NTP). More particularly, the collector computer 26 preferably operates as an intelligent switch for the incoming digital data from multiple hub units 14 by accurately time stamping multiple streams of digital data coming from the hub units 14, packing the data into frames, and then transmitting the data to the distributor computer 42, for example, over a fiber-based Ethernet connection. Suitable components for time stamping multiple data streams and packing data into frames are well known in the art, and therefore will not be discussed in any detail here. The use of a fiber optic cable for the data connection between the collector computer 26 and the distributor computer 42 is preferred for the purpose of reducing the susceptibility of the transmission to lightening, which is desirable since the transmission cable will typically be exposed to an outdoor environment as a result of being routed between the test stand 100 and the remote facility housing the distributor unit 18. The collector computer 26, power supply 28 and controlled environment 30 may all be enclosed within a suitable protective housing (not shown) that protects these components from direct exposure to the elements.

Notably, because of multiplexing at the level of the hub units 14 and synchronization at the level of the collector unit 16, the digital data can be supplied to the distributor unit 18 over a single Ethernet connection, which is in stark contrast to the typical thousands of cables and tubes previously required to transmit sensor output to a remote data acquisition system of the prior art.

Figure 3:
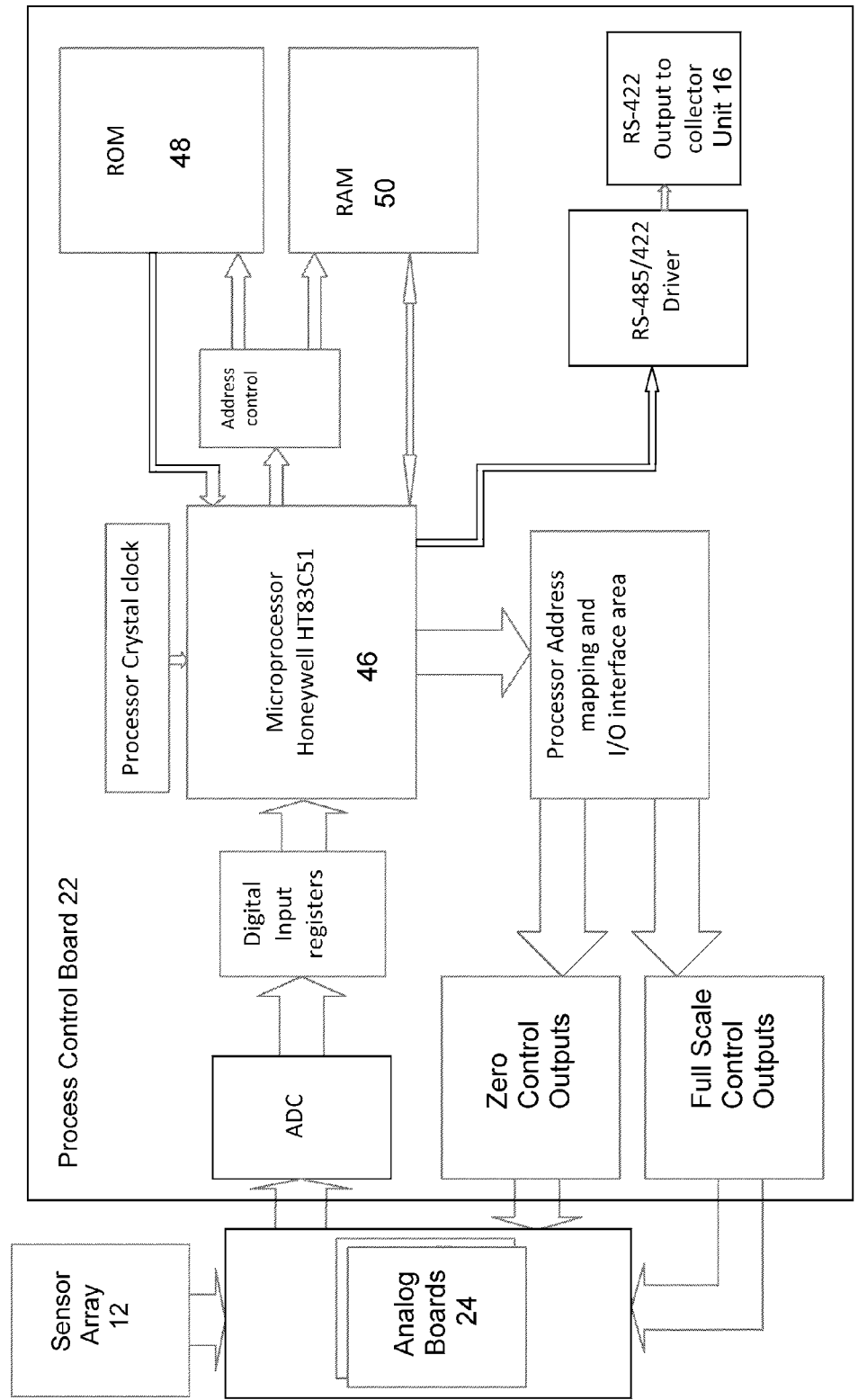
FIG. 3 is a block diagram representing certain components of the monitoring system of FIG. 2, including details of a processor control board of the monitoring system.

FIG. 3 is a block diagram representing the processor control board 22, some of its components, and its connection to the analog signal conditioning boards 24 and the collector unit 16. The processor control board 22 is represented as being equipped with a microprocessor 46 adapted to run from a program stored in ROM (read-only memory) 48, such as an EEPROM (electrically-erasable programmable read only memory), and uses RAM (random access memory) 50 to store the digital data generated from the sensors 20, as well as any variables used in calculations performed by the control board 22. The microprocessor 46 preferably performs a gain setting function associated with the signal conditioning boards 24 (discussed below), controls/selects which individual or blocks of signal channels of the sensors 20 are read, the timing of the data acquisition, error sensing, analog-to-digital conversion, execution of any built-in test (BIT) modes, sensor adaptation (based on the types of sensors 20), and the collection, formatting and transfer of the digital data to the collector computer 26. As indicated in FIG. 3, the input/output (I/O) functions of the board 22 are preferably directed in the form of memory mapped I/O operations. As also seen in FIG. 3, the processor control board 22 also transmits zero and full-scale control outputs to the analog signal conditioning boards 24, as well as directly communicates with the collector computer 26. As will be discussed in reference to the conditioning boards 24 and FIG. 4, the zero and full-scale control outputs transmitted by the control board 22 are part of a continuous calibration scheme that periodically applies a zero voltage and reference voltage to detect and compensate for any drift in the accuracy and precision characteristics of the electronic components of the conditioning boards 24 resulting from variations in temperature and component aging.

As previously noted, the hub unit 14 is intended to operate at temperatures greater than 125° C., and preferably as high as at least 200° C. In preferred embodiments, the microprocessor 46, ROM 48, RAM 50 and passive components mounted to the control board 22 are capable of operating at temperatures above 200° C. To achieve this capability, the microprocessor 46, ROM 48 and RAM 50 are preferably implemented with silicon-on-insulator (SOI) substrates and processing technology. As known in the art, SOI substrates typically comprise a thin epitaxial layer on an insulator. The substrate is typically formed by oxidizing one or both bonding surfaces of a pair of semiconductor (e.g., silicon) wafers prior to bonding the wafers. Most typically, a single silicon dioxide layer is grown on an epitaxial layer formed on a silicon wafer. After bonding the wafers, all but the insulator and epitaxial layer (and optionally the silicon layer of the second wafer) are etched away, such that the silicon dioxide layer forms an insulator that electrically isolates the epitaxial layer. A commercial example of a solid-state microprocessor implemented on an SOI substrate using SOI processing technology is the HT83C51 microprocessor commercially available from Honeywell. Commercial examples of RAM components implemented on SOI substrates include the HT6256 256 Kbit SRAM component available from Honeywell, and commercial examples of ROM components implemented on SOI substrates include ROM components from Twilight Technology Inc.

The substrate on which the electronic components of the processor control board 22 are mounted is also preferably capable of withstanding temperatures of at least 260° C. A preferred high-temperature substrate material is commercially available from Rogers Corporation under the name RO4003C, which is a glass-reinforced hydrocarbon/ceramic laminate. Furthermore, the components are preferably attached with high melting point solders, a notable but non-limiting example of which is 92.5Pb-5Sn-2.5Ag, which has a melting range of about 287 to about 296° C. To reduce thermal stresses resulting from thermal expansion and contraction of the board, the microprocessor 46, ROM 48, RAM 50 and other components on the board 22 are preferably through-hole components having one or more metal leads (sticks) that are inserted into through-holes (typically plated through-holes) in the substrate and then soldered to the substrate. Other approaches to reducing thermal stresses include the use of high-temperature, thermally-conductive potting materials to minimize thermal gradients, increase thermal time constants and damp vibrations, and limiting the number of metallized vias that are susceptible to breaking due to board delamination and expansion/contraction. Notably, the metal leads of the through-hole components are believed to promote the structural integrity of the vias in which they are placed.

With the above-noted high temperature capabilities, the control board 22 can be contained within the hub unit housing 44, preferably without the need for an active cooling system dedicated to maintaining the temperature of the board 22 below 125° C. as would be required by conventional electronics. The term "active cooling" is used herein to mean cooling systems that are specifically designed to transfer heat from the board 22 and out of the hub unit housing 44 by conduction, convection, and/or radiation.

Figure 4:
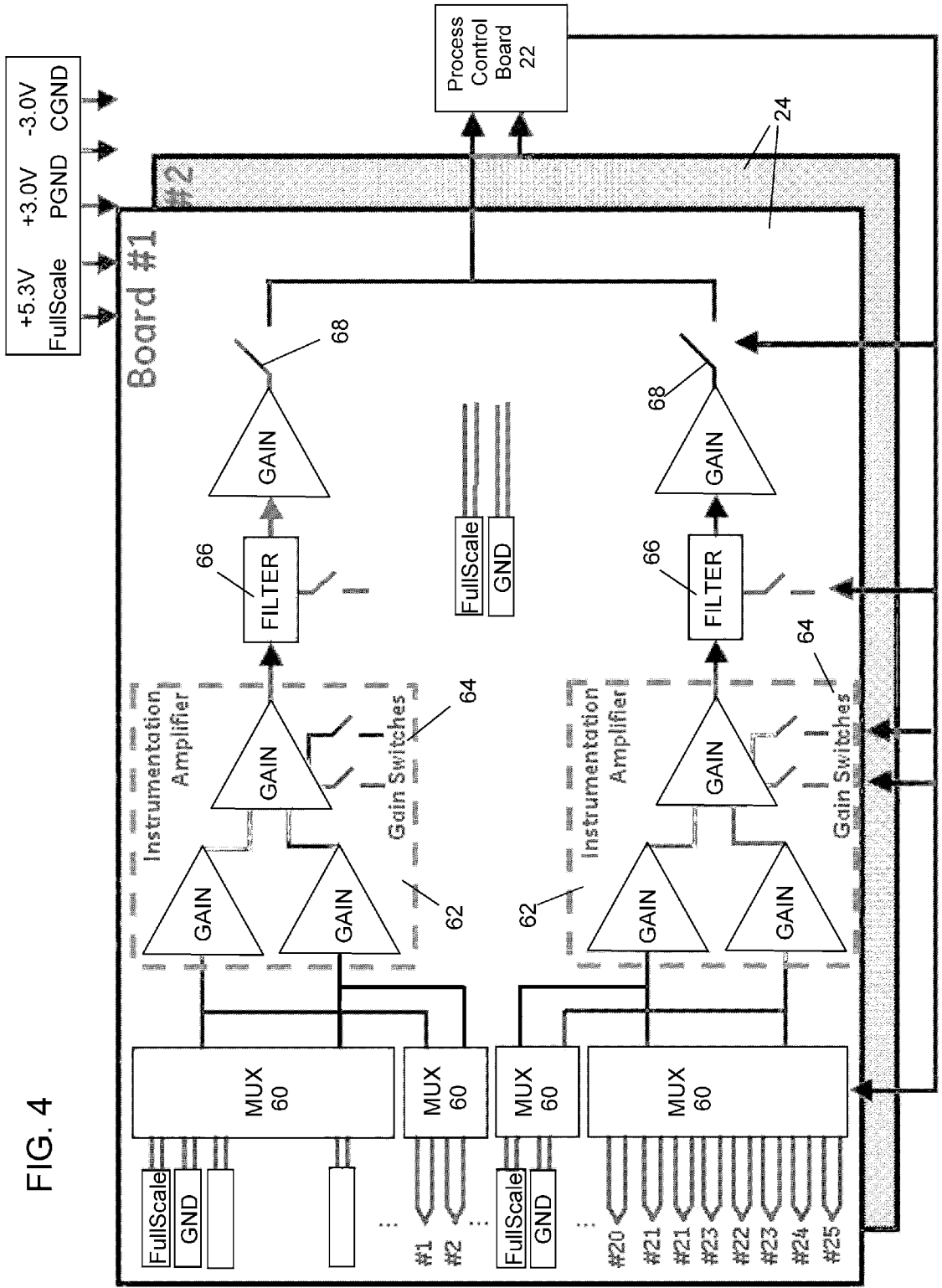
FIG. 4 is a block diagram representing an analog signal conditioning board of the monitoring system of FIG. 2.

FIG. 4 is a block diagram representing two analog signal conditioning boards 24 and their connection to the processor control board 22 of FIG. 3. The analog signal conditioning boards 24 are combined with the processor control board 22 within the housing 44 of the hub unit 14, and as such are also required to operate at high temperatures in the harsh environment of the engine 108. The high temperature operation of the hub unit 14 and its conditioning boards 24 enables the sensors 20, including thermocouples, RTDs, and pressure transducers, to be terminated directly on the engine 108 and their outputs conditioned prior to the A/D (analog-to-digital) conversion performed by the processor control board 22. Furthermore, the hardware of the conditioning boards 24 preferably incorporates the previously-noted continuous calibration, multiplexing and interleaving features.

As note above, the continuous calibration scheme performed on the conditioning boards 24 produces calibration data that can be used by the distributor computer 42 to perform real-time corrections of the digital data acquired from the hub unit 14. The continuous calibration scheme preferably compensates for all passive and active components on the conditioning boards 24 and processor control board 22 that may significantly affect signal accuracy. The need for a continuous calibration feature arises because, at the system level, discrete components are not currently available that do not exhibit drift over the foreseeable operating range of the hub unit 14, for example, about −55° C. to above 200° C. In preferred embodiments of the invention, the continuous calibration scheme provides for zero and full-scale data to be continuously collected, while any drifting of the acquired data over time and temperature is automatically compensated.

Figure 5:
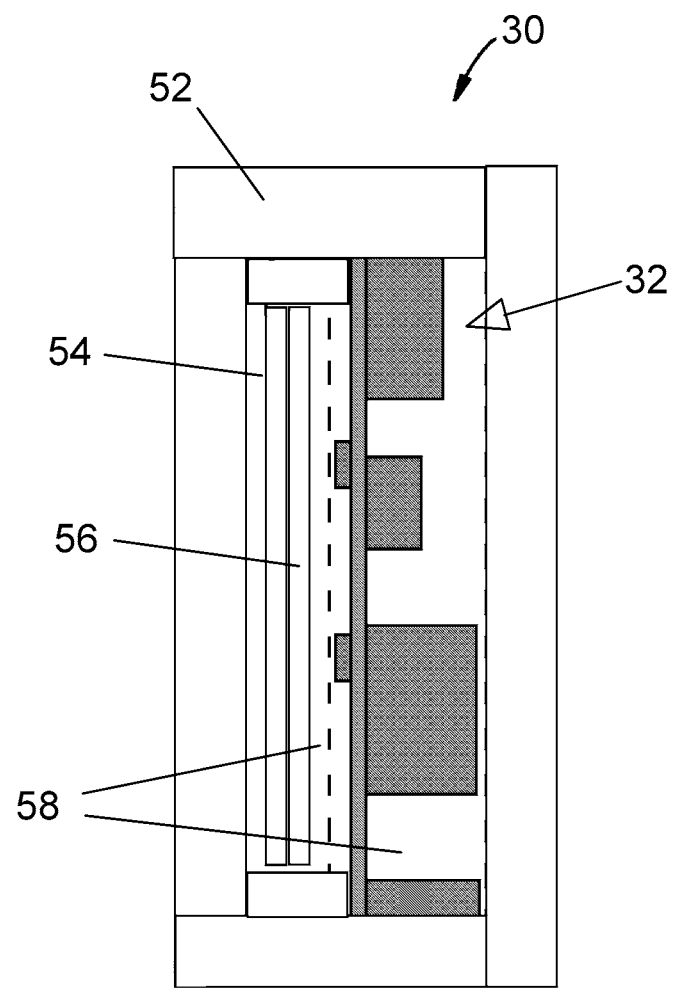
FIG. 5 schematically represents a voltage reference device for use with a collector computer of the monitoring system of FIG. 2.

The continuous calibration feature relies in part on the system voltage reference device 32, represented in FIG. 2 as located in the controlled environment 30 of the collector unit 16 remote from the hub unit 14. Though a location with the collector unit 16 is believed to be preferred, it is foreseeable that other locations could be found suitable for system voltage reference device 32. The controlled environment 30 is schematically represented in greater detail in FIG. 5 as comprising the voltage reference device 32 enclosed within a housing 52, which further contains a heating element 54, copper plate 56 and thermal RTV potting material 58 that achieve uniform heating of the voltage reference device 32. The temperature of the reference device 32 can be regulated to any suitable level, for example, about 55° C. to about 125° C. The reference device 32 generates highly-precise zero and full-scale reference voltages, which are then transmitted over dedicated differential links to the conditioning boards 24.

Temperature-induced drifting in the accuracy and precision of the electrical circuit components of the conditioning boards 24 are captured and recorded along with the analog output signals of the sensors 20 during A/D conversion. During each cycle in which analog output signals are read from the sensors 20, the processor control board 22 causes the highly-precise zero volt and reference voltage signals of the reference device 32 to be transmitted through all analog signal processing paths (channels) defined by the electronic components of each conditioning board 24. The zero volt and reference voltage signals are then used to correct the digitalized sensor data, in that any change in the output voltage from the previous calibration reading is attributed to board-level component drift and transmitted as calibration data to the distributor computer 42, which digitally corrects the digitalized sensor data before further use of the data. In practice, the zero and full-scale reference signals may be applied several times per second. Accuracies over time, temperature and distance on the order of having an accuracy on the order of about +/−20 ppm (parts per million) and less have been achieved in the analog signal processing path with the continuous calibration feature described above.

As part of the calibration scheme, the conditioning boards 24 also provide for multiplexing of multiple signal channels from the sensors 20, enabling each conditioning board 24 to condition multiple sensor signals through a fewer number of circuit paths, for example, two as represented in FIG. 4. Signals from multiple sensors 20 are represented in FIG. 4 as passing through multiplexors 60 to generate multiplexed analog outputs, thereby reducing the number of connections required to transmit the digital data to the collector unit 16 over a serial data connector. Within each circuit path, the multiplexed analog outputs are conditioned with an instrumentation operational amplifier 62. Each amplifier 62 is represented in FIG. 4 as incorporating active gain changes 64 controlled by the processor control board 22, which enables each conditioning board 24 to be used to scale many different sensor types with different voltage outputs to a set output voltage prior to A/D conversion.

As further evidenced from FIG. 4, switches 68 can be used to interleave the multiplexed analog outputs of one bank (group) of sensors 20 along one circuit path on the board 24 with the multiplexed analog outputs of another bank of sensors 20 on another circuit path of the same board 24 to increase system throughput. As one series of multiplexed analog outputs from one bank of sensors 20 is output to the A/D converter of the processor control board 22, sensor outputs on other banks of sensors 20 are at various stages of settling. Once the series of multiplexed analog outputs from the first bank of sensors 20 has been read by the A/D converter, the next bank can be chosen while signals of the first bank begin to settle on a different sensor 20. This feature allows a higher system level throughput to be implemented with slower, but higher-temperature capable circuit components of the processor control board 22 and conditioning boards 24.

The conditioning board 24 depicted in FIG. 4 is further represented as incorporating dynamic, dual-time constant filtering 66 on the amplifier outputs of each operational amplifier 62 and controlled by the processor control board 22. This feature further enables rapid settling when switching between the circuit paths over which the multiplexed analog outputs are transmitted, while still providing a high level of low pass filtering to reduce electrical noise of a sensor output signal present in the engine test environment. Dynamic filtering can be achieved by, for example, removing a resistor from an RC circuit, allowing a rapid output change from one channel voltage to another, then switching the resistor back into the circuit to minimize sensor noise and ripple, improving the analog data quality presented to the A/D converter (ADC).

Notably, each conditioning board 24 is preferably able to accommodate both positive and negative input voltages, for example, in the event that the sensors 20 include thermocouples and pressure transducers that can output negative voltages. Additionally, because the conditioning boards 24 are located in the high temperature environment of the hub unit 14, "cold junction" compensation conventionally performed on thermocouples board can be "hot junction" compensation since thermocouples among the sensors 20 may be at a lower temperature than the thermocouple wire-to-reference junction measured by the conditioning board 24. For this reason, the instrumentation operational amplifiers 62 are preferably capable of differential voltages and scales these±voltages to a positive-only voltage range necessary for A/D conversion.

As with the processor control board 22, at least some of the circuit components of the analog signal conditioning boards 24 are preferably implemented with SOI technology to allow operation of the boards 24 at temperatures of at least 200° C., enabling the entire hub unit 14 to operate at such elevated temperatures. As a result, the hub unit 14 and its control and conditioning boards 22 and 24 overcome prior limitations of data acquisition systems that have necessitated that each individual sensor output must be transmitted by wire or tube to a remote location a considerable distance from an engine under test. Such restrictions have resulted in long wires and tubes routed from engines to the data acquisition systems, incurring additional expense, introducing additional sources of error, and necessitating a considerable amount of man-hours to install and debug. In contrast, the hub unit 14 can be placed directly on the head frame 106, its adapter 110, or even directly on the engine 108, for example, under the cowling 114, resulting in a relatively short distance (for example, less than three meters) between the sensors 20 and their terminations on the hub unit 14.

While the invention has been described in terms of a preferred embodiment, it is apparent that other forms could be adopted by one skilled in the art. For example, the physical configuration of the units 12, 14, 16 and 18 and the components could differ from that shown, and materials and processes other than those noted could be used. Therefore, the scope of the invention is to be limited only by the following claims.

The invention claimed is:

1. A hub unit adapted for use in a monitoring system for monitoring engine performance parameters of a gas turbine engine while operating, the monitoring system comprising sensors mounted on the engine for sensing the engine performance parameters and generating analog sensor outputs, the hub unit comprising:
   a housing;
   a control circuit board and at least one signal conditioning circuit board within the housing, the signal conditioning circuit board being adapted to receive the analog sensor outputs from the sensors, the control circuit board being connected to the signal conditioning circuit board and adapted to produce digital data corresponding to the analog sensor outputs, the control circuit board and the signal conditioning circuit board comprising electrical circuit components that define an analog signal processing path and have accuracy and precision characteristics that drift in response to component aging and to changes in the temperature to which the hub unit is subjected; and
   means for performing a continuous calibration scheme by periodically applying a reference voltage and a zero voltage to the signal conditioning circuit board to determine and remove errors in the analog signal processing path resulting from the drifts of the electrical circuit components of the control circuit board and the signal conditioning circuit board.

2. The hub unit according to claim 1, wherein the hub unit is mounted on the engine or on a test stand supporting the engine.

3. The hub unit according to claim 1, wherein the hub unit is subjected to a temperature in a range of in excess of 125° C. up to at least 200° C.

4. The hub unit according to claim 1, wherein the means for performing the continuous calibration scheme periodically applies the reference voltage and the zero voltage to the signal conditioning circuit board at a frequency of more than once per second.

5. The hub unit according to claim 1, wherein at least some of the electrical circuit components of the control circuit board and the signal conditioning circuit board are implemented on silicon-on-insulator substrates.

6. The hub unit according to claim 1, wherein the electrical circuit components have a maximum operating temperature of greater than 125° C.

7. The hub unit according to claim 1, wherein the hub unit lacks means for actively cooling the hub unit.

8. The hub unit according to claim 1, wherein the reference voltage is a full scale voltage of the signal conditioning circuit board.

9. The hub unit according to claim 1, wherein the removal of errors in the analog signal processing path with the means for performing the continuous calibration scheme results in the analog signal processing path having an accuracy of at least +/−20 ppm.

10. The hub unit according to claim 1, wherein the means for performing the continuous calibration scheme determines the errors in the analog signal processing path by comparing outputs generated by applying the reference voltage and the zero voltage to values of the reference voltage and the zero voltage, and then correcting subsequent digital data based on the comparison.

11. The hub unit according to claim 10, wherein the means for performing the continuous calibration scheme completes the continuous calibration scheme each time analog sensor outputs are acquired.

12. The hub unit according to claim 1, further comprising:
   means on the signal conditioning circuit board for multiplexing a plurality of the analog sensor outputs generated by the sensors to produce an individual multiplexed analog output; and
   at least one amplifier with adjustable gain for scaling the analog sensor outputs of the individual multiplexed analog output to produce an individual conditioned multiplexed analog output from which the corresponding digital data are produced, the amplifier and the adjustable gain thereof being controlled by the control circuit board.

13. The hub unit according to claim 12, wherein the individual multiplexed analog output produced by the multiplexing means is one of a plurality of individual multiplexed analog outputs produced by the multiplexing means and scaled by the at least one amplifier to produce a plurality of individual conditioned multiplexed analog outputs, and each of the individual multiplexed analog outputs is produced from a corresponding set of the analog sensor outputs generated by the sensors, wherein the signal conditioning circuit board further comprises means for interleaving the individual conditioned multiplexed analog outputs to reduce settling time between the sets of the analog sensor outputs and improve throughput to the control circuit board.

14. The hub unit according to claim 13, wherein the interleaving means comprises a dynamic filter that switches passive RC components into and out of a circuit path containing the multiplexing means, the amplifier, and the interleaving means to increase throughput by reducing the settling time.

15. A hub unit adapted for use in a monitoring system for monitoring engine performance parameters of a gas turbine engine operating on a stationary test stand, the monitoring system comprising sensors mounted on the engine for sensing the engine performance parameters and generating analog sensor outputs, the hub unit comprising:

a housing;

a control circuit board and at least one signal conditioning circuit board within the housing, the signal conditioning circuit board being adapted to receive the analog sensor outputs from the sensors, the control circuit board being connected to the signal conditioning circuit board and adapted to produce digital data corresponding to the analog sensor outputs, the control circuit board and the signal conditioning circuit board comprising electrical circuit components that define an analog signal processing path and have accuracy and precision characteristics that drift in response to component aging and to changes in the temperature to which the hub unit is subjected;

means for performing a continuous calibration scheme by periodically applying a reference voltage and a zero voltage to the signal conditioning circuit board to determine and remove errors in the analog signal processing path resulting from the drifts of the electrical circuit components of the control circuit board and the signal conditioning circuit board;

means on the signal conditioning circuit board for multiplexing a plurality of the analog sensor outputs generated by the sensors to produce an individual multiplexed analog output; and at least one amplifier with adjustable gain for scaling the analog sensor outputs of the individual multiplexed analog output to produce an individual conditioned multiplexed analog output from which the corresponding digital data are produced, the amplifier and the adjustable gain thereof being controlled by the control circuit board.

16. The hub unit according to claim 15, wherein the hub unit is mounted on the engine or on the test stand.

17. The hub unit according to claim 15, wherein the hub unit is subjected to a temperature in a range of in excess of 125° C. up to at least 200° C.

* * * * *